(12) United States Patent
Furuya et al.

(10) Patent No.: US 8,342,746 B2
(45) Date of Patent: Jan. 1, 2013

(54) TEMPERATURE MEASUREMENT SYSTEM AND TEMPERATURE MEASUREMENT METHOD

(75) Inventors: Atsushi Furuya, Kawasaki (JP); Junichi Ishimine, Kawasaki (JP); Yuji Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/349,735

(22) Filed: Jan. 13, 2012

(65) Prior Publication Data

US 2012/0213247 A1  Aug. 23, 2012

(30) Foreign Application Priority Data

Feb. 21, 2011  (JP) .................................. 2011-034996

(51) Int. Cl.
*G01J 5/00* (2006.01)

(52) U.S. Cl. ...................................................... 374/121

(58) Field of Classification Search .................... 374/121
See application file for complete search history.

(56) References Cited

U.S. PATENT DOCUMENTS 6,036,360 A * 3/2000 Takata et al. ................. 374/124
7,856,495 B2  12/2010 Chainer et al.
7,883,266 B2  2/2011 Campbell et al.
2010/0218600 A1 * 9/2010 Auge et al. ..................... 73/295
2012/0052785 A1 * 3/2012 Nagamatsu et al. .......... 454/184

FOREIGN PATENT DOCUMENTS

| JP | 11-006770 | 1/1999 |
| JP | 11-083643 | 3/1999 |
| JP | 2000-323883 | 11/2000 |
| JP | 2002-118387 | 4/2002 |

OTHER PUBLICATIONS

"Extended European Search Report" EESR, mailed by EPO and corresponding to European application No. 12150747.9 on May 7, 2012.

* cited by examiner

*Primary Examiner* — Lisa Caputo
*Assistant Examiner* — Jamel Williams
(74) *Attorney, Agent, or Firm* — Fujitsu Patent Center

(57) ABSTRACT

A temperature measurement system including a measurement plate placed on a measurement plane specified on at least one of an intake opening and an exhaust opening of a rack storing an information processing apparatus or at a position being away from the measurement plane by a predetermined distance; and an infrared camera configured to capture an image of the measurement plate, where the infrared camera is placed at a position with which the measurement plane is not captured and the measurement plate is captured by the infrared camera.

10 Claims, 10 Drawing Sheets

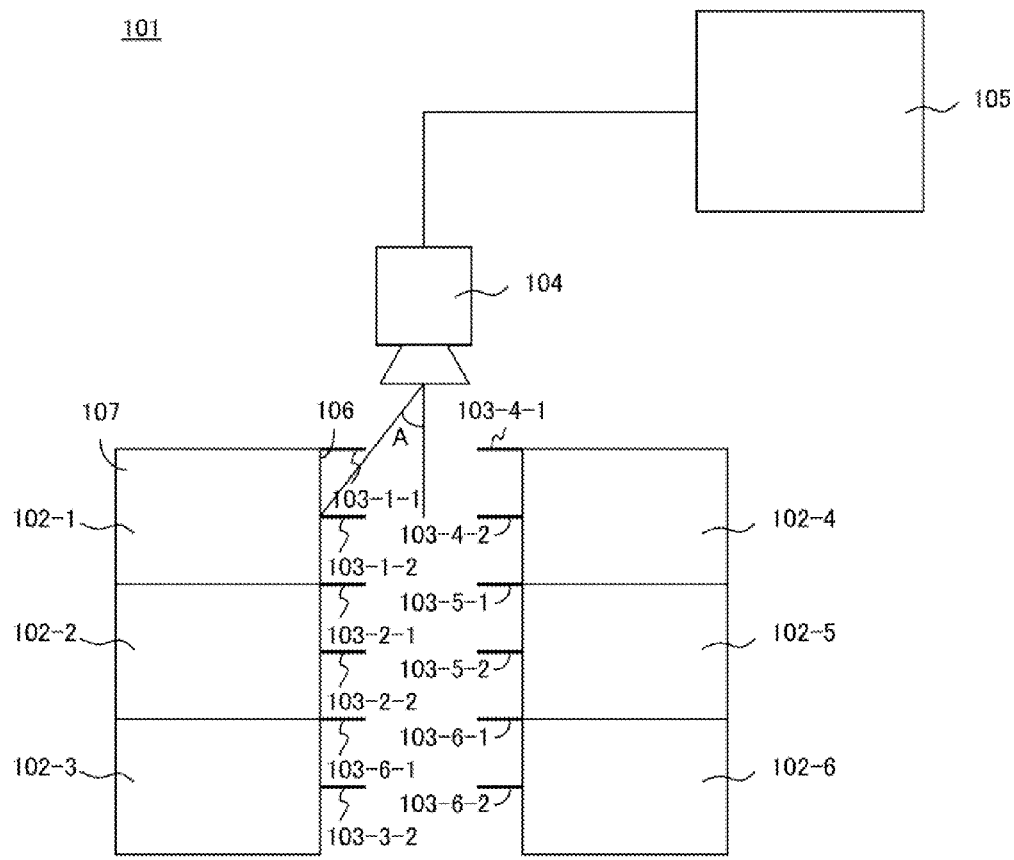
F I G. 1

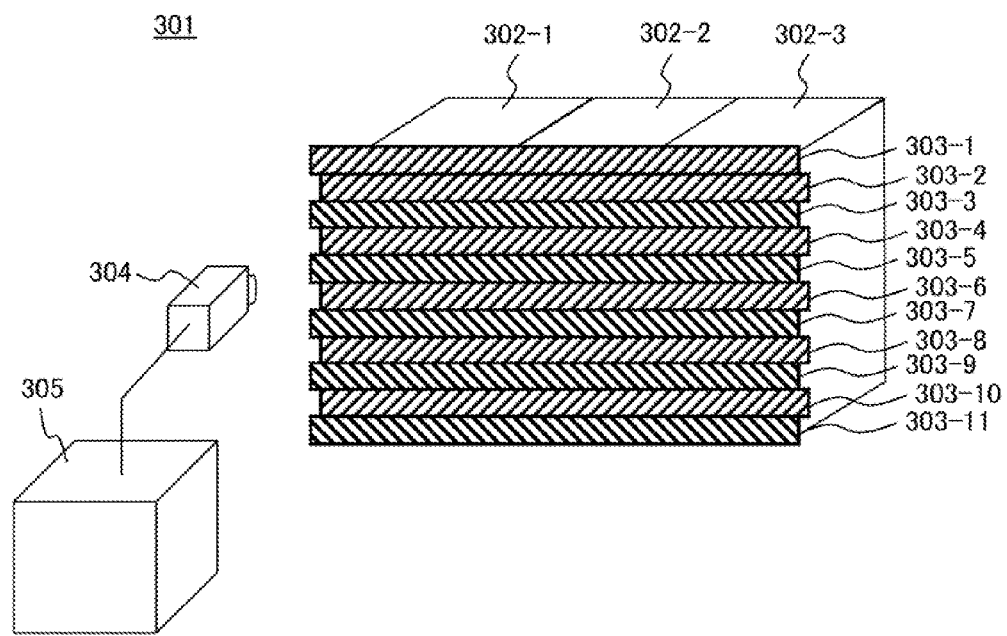
F I G. 9

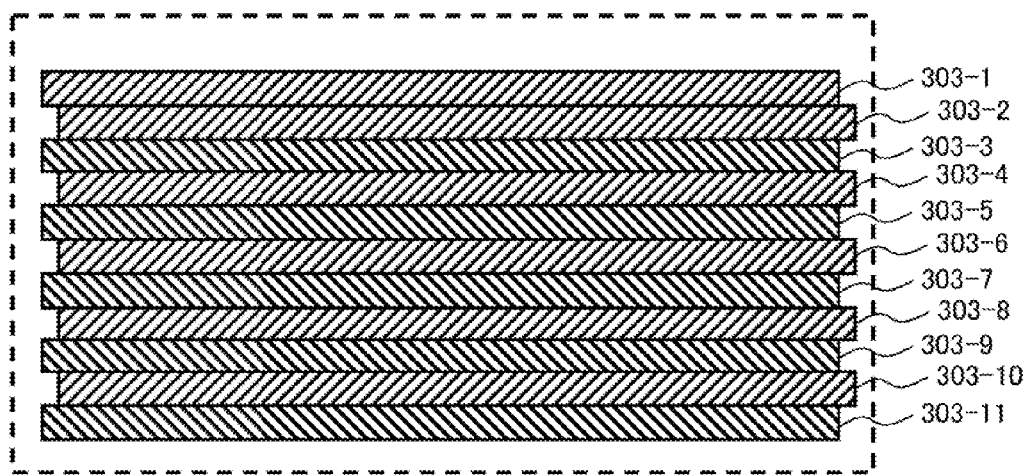
F I G. 10

TEMPERATURE MEASUREMENT SYSTEM AND TEMPERATURE MEASUREMENT METHOD

CROSS-REFERENCE TO RELATED APPLICATIONS

This application is based upon and claims the benefit of priority of the prior Japanese Patent Application No. 2011-34996, filed on Feb. 21, 2011, the entire contents of which are incorporated herein by reference.

FIELD

The embodiments discussed herein are related to a system and method to measure the intake temperature or the exhaust temperature of an information processing apparatus.

BACKGROUND

In a room or space called a data center, a machine room or a server room, Information Technology (IT) devices such as servers, and a rack on which IT devices are stacked and mounted are placed.

An IT device has functional components such as the Central Processing Unit (CPU), the memory, and the like, and the functional components fulfill their functions while consuming power. Then, heat is generated as a result, but in order to guarantee the operation, or in order to secure the reliability of the operation, the temperature of functional components need to be kept equal to or below a certain temperature. For this reason, IT devices generally have an airflow generation component, for cooling by forced air cooling and the like.

For a general IT device, on an assumption that air of a temperature equal to or below a certain temperature is taken in from an air intake, the upper limit temperature of the air to be taken is determined as the operation guarantee temperature. In a data center and a machine room, a number of IT devices are placed in a certain space/room, and if no measure is taken, the temperature of the air in the space/room keeps increasing by heat generation by the IT devices.

Then, in a data center and a machine room in which IT devices are placed, generally, in the same space/room or in a separately-provided room, space, an air conditioning system that has a function to draw heat from the IT device installation area and to release it outside the area in which the IT devices are placed is provided so that the operation guarantee temperature of the IT devices is not exceeded.

Therefore, in the air circulation of the space/room, the reasonable form is that the air of a relatively row temperature released from the air conditioning system is provided to the air intake plane of the IT devices/IT device mounting rack, and the airflow generation component such as a fan built in the IT device is driven to take it in, thereby cooling the functional components such as the CPU, and the air of a relatively high temperature that has drawn the heat of the IT device is released from the IT device's outlet. The air promptly returns to the intake of the air conditioning system, and is taken in into the air conditioner, where its heat is drawn and it becomes air of a low temperature, and is blown out of the air conditioner.

In a general data center, IT devices are placed in the center part of the computer room, and the air conditioner is placed in the peripheral area of the computer room. In some cases, it is placed outside the computer room in which IT devices are placed, and as a result, it may be placed in the surroundings of the IT device installation area. In this case, the air conditioner is in charge of cooling IT devices in a broad area, and performing generally-even cooling.

However, in a data center, if heat generation density of the IT devices is not even and heat generation is concentrated locally, the airflow required by the IT devices also increases locally, and an air conditioner that provides evenly-cold air can no longer provide the required air volume. When supply of cold air falls short, the exhaust of the IT devices comes around to the intake plane side, making an area where the intake temperature of the IT device is high. The reliability of an IT device generally decreases when its intake temperature becomes high, and its life is also shortened.

As a method for solving this problem, additional installment of an air conditioner placed in the outer circumference of the computer room would be possible, but it is difficult to deliver the effect to a specific place, and energy will be wasted as the effect extends into a broad area and useless cooling will be performed for the part that does not require additional cooling power.

As another solution, there is a method in which a local air conditioner is installed in the vicinity of an IT device that has a high heat generation density. Since installment can be made in the vicinity of the area with local heat generation, the efficiency may be improved.

In data centers in recent years, the intake area and the exhaust area are often separated. By doing so, cold air released from the air conditioner is provided to the intake plane of the IT device, to avoid exhaust of a high temperature from coming around to the IT device intake plane to improve the reliability of the IT device, and the exhaust of the IT device is returned to the air conditioner while keeping it at the high temperature, to improve the efficiency of the air conditioner.

In the viewpoint of safe operation, it is important to measure and manage the intake temperature and the exhaust temperature of the IT devices in a data center. Especially in a data center, a number of IT devices are aligned and installed and a wide area is managed collectively, the temperature distribution in a wide area needs to be measured efficiently.

In the conventional intake/exhaust temperature management method, a temperature sensor such as a thermistor and the like that obtains temperature information from an electric signal is placed on the intake plane or the exhaust plane of the rack. With this method, however, there has been a problem that a large number of sensors need to be prepared and installed to capture temperature distribution in a wide area, especially temperature distribution in the wide area in which a plurality of IT devices are aligned and installed, which is troublesome.

[Patent document 1] Japanese Laid-open Patent Publication No. H11-6770
[Patent document 2] Japanese Laid-open Patent Publication No. 2000-323883
[Patent document 3] Japanese Laid-open Patent Publication No. 2002-118387
[Patent document 4] Japanese Laid-open Patent Publication No. H11-83643

SUMMARY

According to an aspect of the invention, a temperature measurement system includes a measurement plate placed on a measurement plane specified on at least one of an intake opening and an exhaust opening of a rack storing an information processing apparatus or at a position being away from the measurement plane by a predetermined distance; and an infrared camera configured to capture an image of the measurement plate.

The infrared camera is placed at a position with which the measurement plane is not captured and the measurement plate is captured by the infrared camera.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a configuration diagram of a temperature measurement system according to the first embodiment.

FIG. 9 is an oblique perspective of the temperature measurement system according to the third embodiment.

FIG. 10 is a camera image of an infrared camera according to the third embodiment.

DESCRIPTION OF EMBODIMENT(S)

Hereinafter, embodiments are described with reference to the drawings.

First Embodiment

FIG. 1 is a configuration diagram of a temperature measurement system according to the first embodiment.

Figure 2:
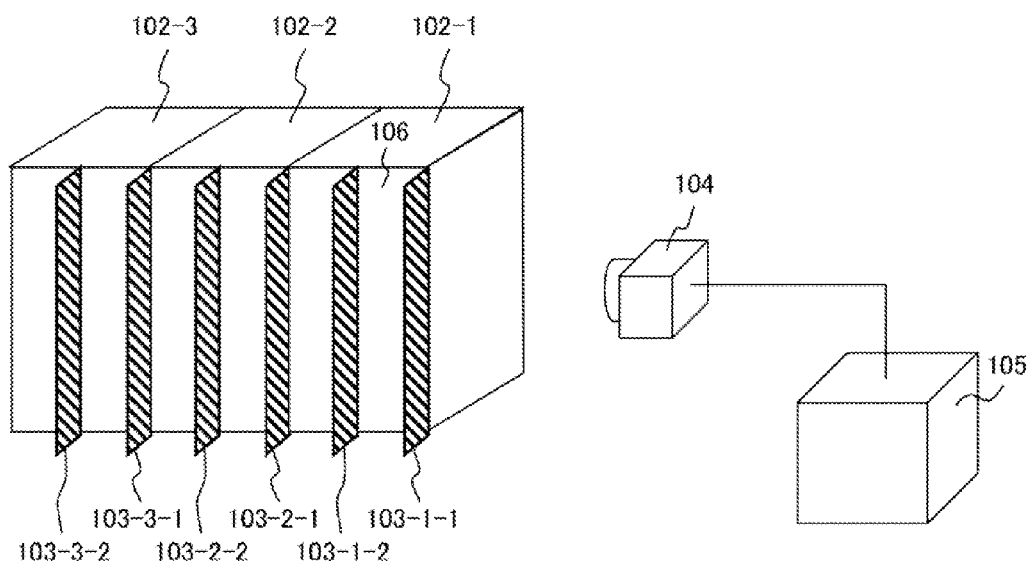
FIG. 2 is an oblique perspective of a rack and a temperature measurement plate according to the first embodiment.

FIG. 2 is an oblique perspective of a rack and a measurement plate according to the first embodiment.

A temperature measurement system 101 according to the first embodiment has a plurality of racks 102-*n* (n=1-6), a plurality of temperature measurement plates 103-*n*-*m* (m=1-2), an infrared camera 104, and a measurement apparatus 105.

Meanwhile, FIG. 1 is a top view of the temperature measurement system 101, and in FIG. 2, in order to make it easier to view the racks 102 and the temperature measurement plates 103, a part of the racks 102 and the temperature measurement plates 103 is omitted.

On the rack 102, information processing apparatuses such as a server and a storage are mounted. The rack 102 is a rectangular solid, and has an intake plane 106 on which an intake opening to intake air is provided and an exhaust plane 107 on which an exhaust opening to release air is provided. In the first embodiment, the front plane of the rack 102 is the intake plane 106, and the back plane is the exhaust plane 107.

The racks 102 are arranged in parallel in two rows with three units each, and are aligned so that the intake planes 106 of the respective rows face each other. In addition, the lateral sides of adjacent racks 102 are in close contact with each other.

Two temperature measurement plates 103 are attached per rack.

The temperature measurement plane 103 is attached to an end of the intake plane 106 closer to the infrared camera 104 and in the center. The temperature measurement plane 103 is attached perpendicularly to the intake plane 106 and in the top-bottom (longitudinal) direction (the perpendicular direction to the installment plane of the rack 102).

The length of the temperature measurement plate 103 (the height direction of the rack 102) is the same a the height of the rack 102.

The thickness of the temperature measurement plate 103 is set as 1 millimeter or below.

It is desirable that, in order to reduce the influence from the reflection of the infrared ray, the temperature measurement plate 103 is in the black color that has a low infrared ray reflection rate. In addition, the temperature measurement plate 103 is made of a material such as paper, cloth, plastic, or metal, and the like.

Since the temperature measurement plate 103 is attached on the intake plane 106 or the exhaust plane 107, the temperature of the temperature measurement plate 103 becomes almost equal to the intake temperature or the exhaust temperature, and emits infrared ray corresponding to the temperature. Therefore, by measuring the temperature of the temperature measurement plate 103, it becomes possible to know the intake temperature or the exhaust temperature.

The infrared camera 104 detects infrared ray emitted from an object.

The infrared camera 104 is installed so as to capture the space between racks 104 aligned in two rows.

The measurement apparatus 105 analysis data obtained from the infrared camera 104, and performs display, measurement and the like of the temperature data. Meanwhile, the infrared camera 104 may be configured to include functions of the measurement apparatus 105.

Since the lateral side of the rack 102 has an opaque side wall, the information processing apparatuses mounted inside the rack 102 are not to be seen from the lateral side, but since the intake plane 106 has the intake opening and the exhaust plane has the exhaust opening, the information processing apparatuses mounted inside the rack 102 are seen from the intake plane 106 or the exhaust plane 107. Therefore, if the information processing apparatuses are seen from the infrared camera 104, the temperature of the information processing apparatus is measured, so the infrared camera is placed so that the intake plane 106 or the exhaust plane 107 are not to be seen from the infrared camera 104 by means of the temperature measurement plate 103.

Looking at temperature measurement system 101 from above, the angle between the optical axis of the lens of the infrared camera 104 and the line connecting the center of the lens and the center of the rack 102-1 that is closest to the infrared camera is assumed to be angle A.

In the first embodiment, the infrared camera 104 is installed so that the angle A falls between 30 degrees and 90 degrees.

For example, it is preferable that, when the infrared camera is installed so that the angle A becomes 45 degrees, the width of the temperature measurement plate 103 is half of the width of the rack when two temperature measurement plates are attached per rack and the width of the temperature measurement plate 103 is one third of the width of the rack when three temperature measurement plates are attached per rack, so that the intake plane 106 is not to be seen from the infrared camera.

Meanwhile, the installment position of the infrared camera 104, the width of the temperature measurement plate 103, and the number of the temperature measurement plates may be set arbitrarily within the range of conditions in which all the temperature measurement plates 103 can be seen and the intake plane 106 and the exhaust plane 107 can not be seen from the infrared camera 104.

Figure 3:
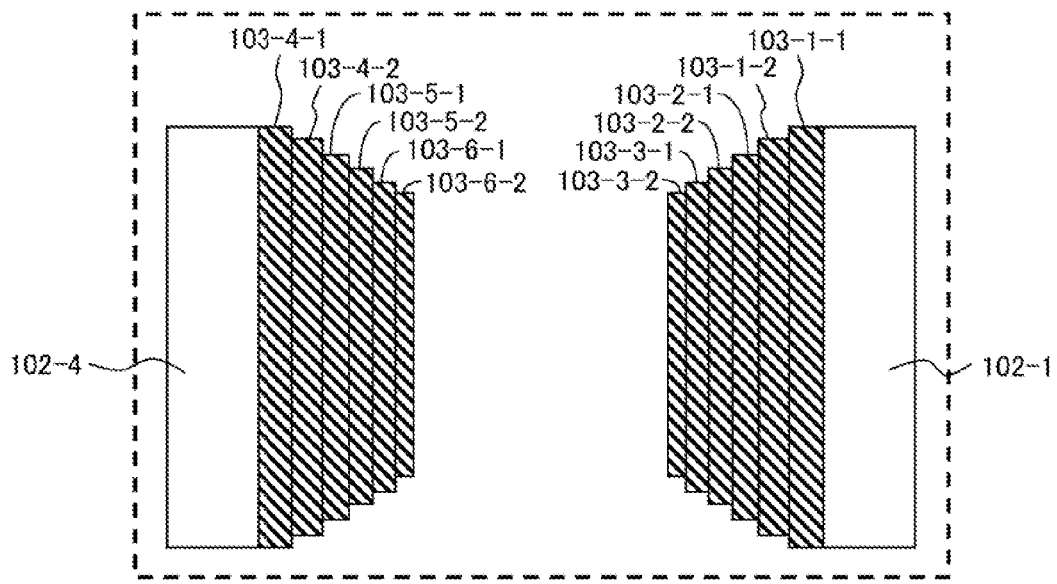
FIG. 3 is a camera image of an infrared camera according to the first embodiment.

FIG. 3 is a camera image of the infrared camera according to the first embodiment.

In the camera image in FIG. 3, the intake plane 106 is not captured, and all the temperature measurement plates 103 are captured. Therefore, it becomes possible to measure the intake temperature of the information processing apparatuses mounted on the rack 103 from the camera image.

Figure 4:
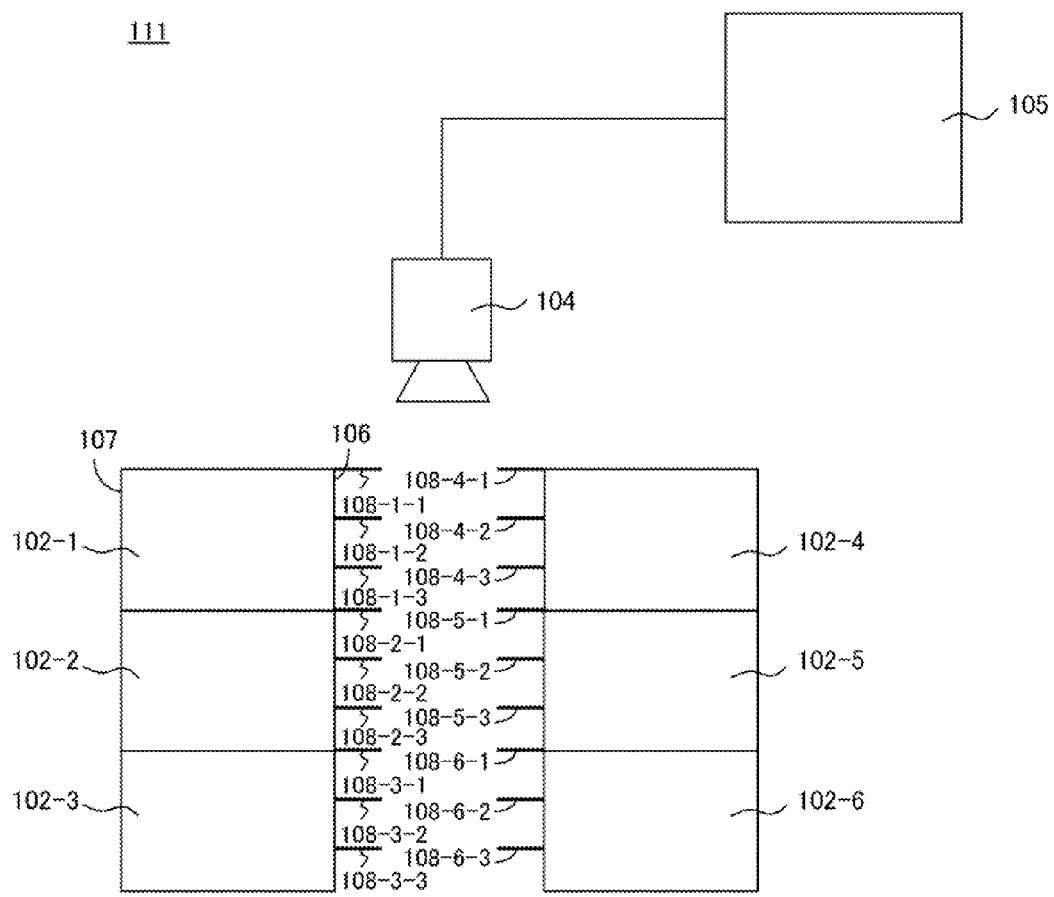
FIG. 4 is another configuration diagram of a temperature measurement system according to the first embodiment.

FIG. 4 is another configuration diagram of a temperature measurement system according to the first embodiment.

The temperature measurement system 111 according to the first embodiment has a plurality of racks 102-$n$ (n=1-6), a plurality of temperature measurement plates 108-$n$-$k$ (k=1-3), an infrared camera 104 and a measurement apparatus 105.

Since the racks 102, the infrared camera 104 and the measurement apparatus 105 are the same as those described above, description of them is omitted.

In the temperature measurement system 111, three temperature measurement plates 108 are attached per rack.

The temperature measurement plates 108 are attached to the end of the intake plane 106 on the side that is close to the infrared camera 104, and at the positions corresponding to one third and two thirds of the width of the rack from the end. The temperature measurement plate 108 is attached perpendicularly to the intake plane 106 and in the top-bottom (longitudinal) direction of the rack 102.

The length, thickness, and material of the temperature measurement plate 108 are the same as the temperature measurement plate 103.

According to the temperature measurement system 101 according to the first embodiment, temperature measurement is performed by image capturing of the temperature measurement plates 103, 108 by the infrared camera 104, making it possible to measure the intake temperature or the exhaust temperature easily.

Second Embodiment

Figure 5:
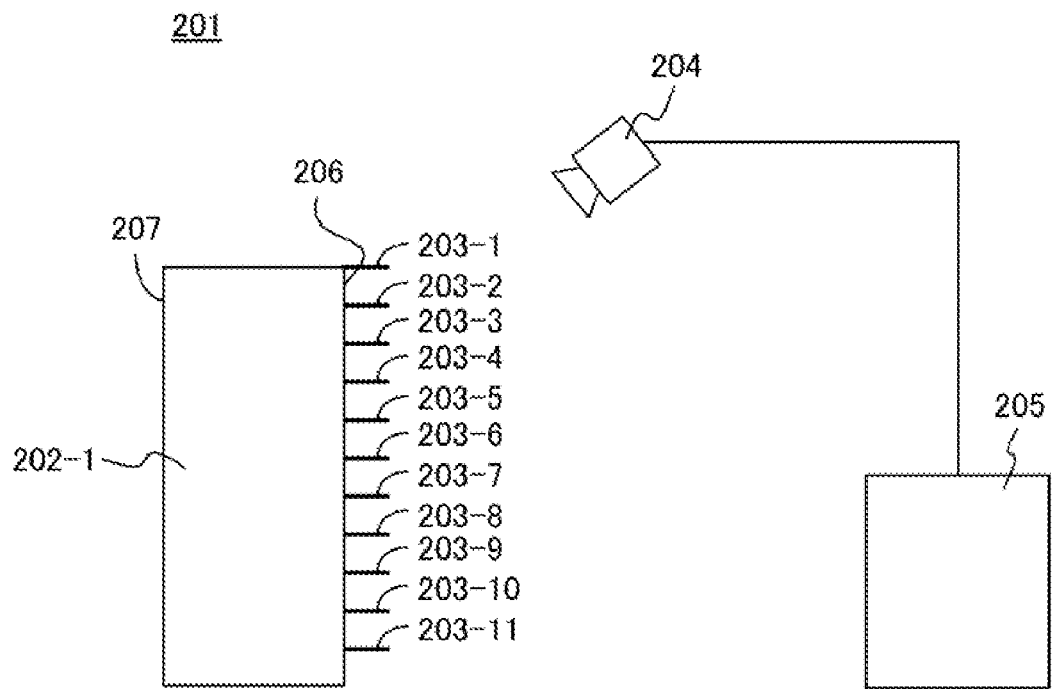
FIG. 5 is a side view of a temperature measurement system according to the second embodiment.

FIG. 5 is a side view of a temperature measurement system according to the second embodiment.

Figure 6:
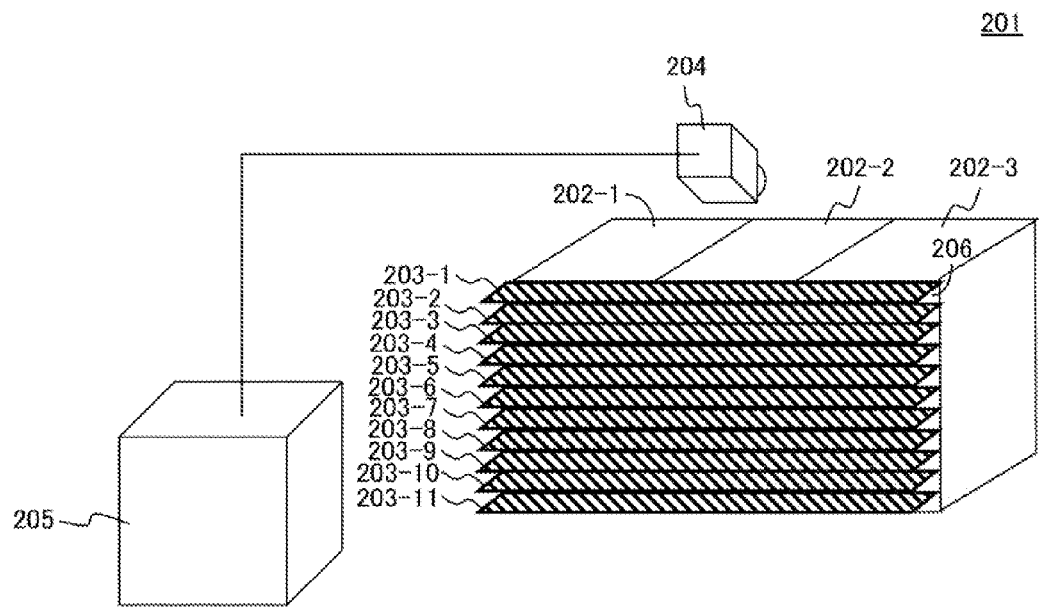
FIG. 6 is an oblique perspective of the temperature measurement system according to the second embodiment.

FIG. 6 is an oblique perspective of the temperature measurement system according to the second embodiment.

A temperature measurement system 201 according to the second embodiment has a plurality of racks 202-$p$ (p=1-3), a plurality of temperature measurement plates 203-$q$ (q=1-11), an infrared camera 204, and a measurement apparatus 205.

Since the functions of the rack 202, the temperature measurement plate 203, the infrared camera 204, and the measurement apparatus 205 according to the second embodiment are the same as those of the rack 102, the temperature measurement plate 103, the infrared camera 104 and the measurement apparatus 105 according to the first embodiment, their description is omitted.

In the second embodiment, three racks 202 are placed next to each other.

The temperature measurement plate 203 is attached vertically to an air intake plane 206 and in the horizontal (lateral) direction (the direction parallel to the plane on which rack 202 is placed).

The length of the temperature measurement plane 203 is equal to the width of the three racks 202.

The temperature measurement plate 203 is attached at a predetermined interval from the top of the air intake plane 206 in the downward direction. In the second embodiment, 11 temperature measurement plates 203 are attached.

The infrared camera 204 is placed in the front upper part of the air intake plane 206. For example, the infrared camera 024 is placed on the ceiling of the room in which the rack 202 is placed. Specifically, the infrared camera is placed on a position from which all the temperature measurement plates 203 are captured and the air intake plane is not captured.

Figure 7:
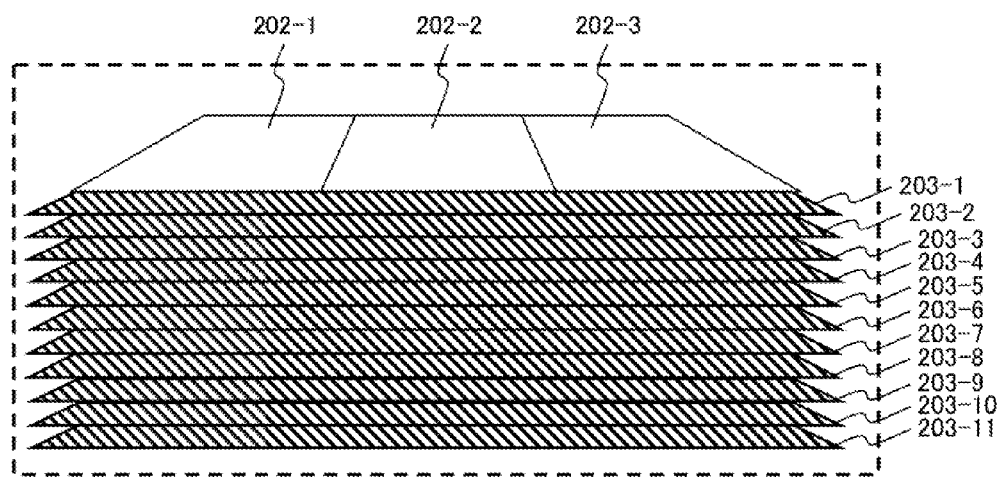
FIG. 7 is a camera image of an infrared camera according to the second embodiment.

FIG. 7 is an infrared camera image according to the second embodiment.

In the camera image in FIG. 7, the air intake plane 206 is not captured, and all the temperature measurement plate 203 is captured. Therefore, it becomes possible to measure the intake temperature of the information processing apparatus mounted on the rack 203 from the camera image.

Meanwhile, while the intake temperature is measured by attaching the temperature measurement plate 203 to the air intake plane 206 in the second embodiment, the exhaust temperature may be measured by attaching it to the exhaust plane 207.

Third Embodiment

Figure 8:
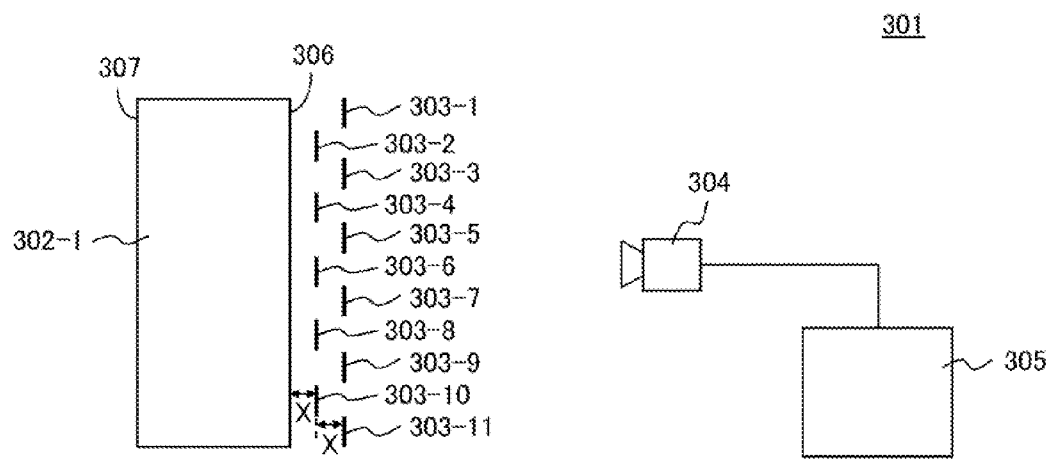
FIG. 8 is a side view of a temperature measurement system according to the third embodiment.

FIG. 8 is a side view of a temperature measurement system according to the third embodiment.

FIG. 9 is an oblique view of a temperature measurement system according to the third embodiment.

A temperature measurement system 301 according to the third embodiment has a plurality of racks 302-$p$ (p=1-3), a plurality of temperature measurement plates 303-$q$ (q=1-11), an infrared camera 304, and a measurement apparatus 305.

Since the functions of the rack 302, the temperature measurement plate 303, the infrared camera 304, and the measurement apparatus 305 according to the third embodiment are the same as those of the rack 102, the temperature measurement plate 103, the infrared camera 104 and the measurement apparatus 105 according to the first embodiment, their description is omitted.

In the third embodiment, three racks 302 are placed next to each other.

In the third embodiment, 11 temperature measurement plates 303 are used. The width of one temperature measurement plate 303 is supposed to be one eleventh of the height of the rack 302. The length of the temperature measurement plate 303 is equal to or longer than width of the three racks 302.

The temperature measurement plate 303 is placed in parallel to the air intake plane 206 and at a certain distance from the air intake plane 306 and in the horizontal (lateral) direction.

Specifically, the temperature measurement plate 303-1 is placed so that the top end position of the temperature measurement plate 303-1 is aligned with the height of the rack 302, and to be away from the air intake plane 306 by a distance 2X.

The temperature measurement plate 303-2 is placed so that the top end position of the temperature measurement plate 303-2 is aligned with the level of the bottom end of the temperature measurement plate 303-1, and to be away from the air intake plane 306 by a distance X.

Thereafter, by placing the temperature measurement plate 303 in the same manner, the temperature measurement plates 303-(2r+1) (r=0-5) are placed to be away from the air intake plane 306 by the distance 2X and the temperature measurement plate 303-2r is placed to be away from the air intake plane 206 by the distance X.

By placing the temperature measurement plates 303 at different distances alternately, air can be taken from the space between the temperature measurement plates 303, making it possible to reduce impact on the air intake.

As for the distance X between the air intake plane 306 and the temperature measurement plate 303, if the distance X is too small, it affects the air intake negatively, and if the distance X is too large, the difference between the intake temperature and the temperature of the temperature measurement plate 303 increases, making it impossible to measure the intake temperature accurately, so the distance X is set to an appropriate value. For example, in the third embodiment, the distance X is set as equivalent to the width of the temperature measurement plate 303.

By placing the temperature measurement plates 303 as described above, from the front (air intake) plane, it looks like the temperature measurement plates 303 covers the front plane of the rack 302.

The infrared camera 304 is placed in front of the rack 302 across the temperature measurement plates 303, and captures the image of the temperature measurement plates 303. The infrared camera 304 is placed in front of the rack 302-2 placed in the center among the three racks 302. In addition, the infrared camera 304 is placed, for example, at the position of the half of the height of the rack 302.

FIG. 10 is an infrared camera image according to the third embodiment.

In the camera image in FIG. 10, the air intake plane 306 is not captured, and all the temperature measurement plates 303 are captured. Therefore, it becomes possible to measure the intake temperature of the information processing apparatus mounted on the rack 303, from the camera image.

Meanwhile, while the intake temperature is measured by attaching the temperature measurement plate 303 to the air intake plane 306 in the second embodiment, the exhaust temperature may be measured by attaching it to the exhaust plane 307.

In addition, any number of the temperature measurement plates 303 may be used.

According to the temperature measurement system 301 according to the third embodiment, since the temperature measurement is performed by capturing the temperature measurement plates 303 by the infrared camera 304, it becomes possible to measure the intake temperature or the exhaust temperature easily.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment (s) of the present invention has (have) been described in detail, it should be understood that the various changes, substitutions, and alterations could be made hereto without departing from the spirit and scope of the invention.

What is claimed is:

1. A temperature measurement system comprising:
   a measurement plate placed on a measurement plane specified on at least one of an intake opening and an exhaust opening of a rack storing an information processing apparatus or at a position being away from the measurement plane by a predetermined distance; and
   an infrared camera configured to capture an image of the measurement plate, wherein
   the infrared camera is placed at a position with which the measurement plane is not captured and the measurement plate is captured by the infrared camera.

2. The temperature measurement system according to claim 1, wherein
   the measurement plate is placed vertically to the measurement plane and in a vertical direction to a plane on which the rack is placed.

3. The temperature measurement system according to claim 2, wherein
   a length of the measurement plate in a height direction of the rack is equal to a height of the rack.

4. The temperature measurement system according to claim 1, wherein
   the measurement plate is placed in a direction that is vertical to the measurement plane and is parallel to a plane on which the rack is placed.

5. The temperature measurement system according to claim 1, wherein
   the measurement plate is placed in parallel to the measurement plane.

6. A temperature measurement method comprising:
   placing a measurement plate on a measurement plane specified on at least one of an intake opening and an exhaust opening of a rack storing an information processing apparatus or at a position being away from the measurement plane by a predetermined distance;
   placing an infrared camera at a position with which the measurement plane is not captured and the measurement plate is captured by the infrared camera; and
   capturing an image of the measurement plate by the infrared camera.

7. The temperature measurement method according to claim 6, wherein
   the measurement plate is placed vertically to the measurement plane and in a vertical direction to a plane on which the rack is placed.

8. The temperature measurement method according to claim 7, wherein
   a length of the measurement plate in a height direction of the rack is equal to a height of the rack.

9. The temperature measurement method according to claim 6, wherein
   the measurement plate is placed in a direction that is vertical to the measurement plane and is parallel to a plane on which the rack is placed.

10. The temperature measurement method according to claim 6, wherein
    the measurement plate is placed in parallel to the measurement plane.

* * * * *